United States Patent
Mears et al.

(10) Patent No.: US 10,084,045 B2
(45) Date of Patent: Sep. 25, 2018

(54) SEMICONDUCTOR DEVICE INCLUDING A SUPERLATTICE AND REPLACEMENT METAL GATE STRUCTURE AND RELATED METHODS

(71) Applicant: ATOMERA INCORPORATED, Los Gatos, CA (US)

(72) Inventors: Robert J. Mears, Wellesley, MA (US); Tsu-Jae King Liu, Fremont, CA (US); Hideki Takeuchi, Austin, TX (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 15/633,918

(22) Filed: Jun. 27, 2017

(65) Prior Publication Data

US 2017/0301757 A1    Oct. 19, 2017

Related U.S. Application Data

(62) Division of application No. 14/948,547, filed on Nov. 23, 2015, now Pat. No. 9,722,046.

(Continued)

(51) Int. Cl.
*H01L 29/15* (2006.01)
*H01L 29/06* (2006.01)
(Continued)

(52) U.S. Cl.
CPC ........ *H01L 29/154* (2013.01); *H01L 29/0653* (2013.01); *H01L 29/1054* (2013.01);
(Continued)

(58) Field of Classification Search
CPC ............ H01L 29/0642; H01L 29/0653; H01L 29/1054; H01L 29/1083; H01L 29/152;
(Continued)

(56) References Cited

U.S. PATENT DOCUMENTS

| 4,485,128 A | 11/1984 | Dalal et al. |
| 4,590,399 A | 5/1986 | Roxlo et al. |

(Continued)

FOREIGN PATENT DOCUMENTS

| EP | 0 843 361 | 5/1998 |
| GB | 2 347 520 | 6/2000 |

(Continued)

OTHER PUBLICATIONS

Shinada et al., Nature 437, 1128 (2005)) Retrieved from Internet Jun. 19, 2015; 3 pgs See Priority U.S. Appl. No. 14/948,547, filed Nov. 23, 2015.

(Continued)

*Primary Examiner* — Allan R Wilson
(74) *Attorney, Agent, or Firm* — Allen, Dyer, Doppelt + Gilchrist, P.A.

(57) ABSTRACT

A semiconductor device may include a substrate having a channel recess therein, a plurality of spaced apart shallow trench isolation (STI) regions in the substrate, and source and drain regions spaced apart in the substrate and between a pair of the STI regions. A superlattice channel may be in the channel recess of the substrate and extend between the source and drain regions, with the superlattice channel including a plurality of stacked group of layers, and each group of layers of the superlattice channel including stacked base semiconductor monolayers defining a base semiconductor portion and at least one non-semiconductor monolayer constrained within a crystal lattice of adjacent base semiconductor portions. A replacement gate may be over the superlattice channel.

22 Claims, 12 Drawing Sheets

Related U.S. Application Data

(60) Provisional application No. 62/083,994, filed on Nov. 25, 2014.

(51) Int. Cl.
*H01L 29/10* (2006.01)
*H01L 29/165* (2006.01)
*H01L 29/66* (2006.01)

(52) U.S. Cl.
CPC ........ *H01L 29/1083* (2013.01); *H01L 29/165* (2013.01); *H01L 29/66431* (2013.01)

(58) Field of Classification Search
CPC ... H01L 29/154; H01L 29/155; H01L 29/165; H01L 29/66431; H01L 29/66545; H01L 29/66621; H01L 29/7782
See application file for complete search history.

(56) References Cited

U.S. PATENT DOCUMENTS

| | | |
|---|---|---|
| 4,594,603 A | 6/1986 | Holonyak, Jr. |
| 4,595,603 A | 6/1986 | Holonyak, Jr. |
| 4,882,609 A | 11/1989 | Schubert et al. |
| 4,908,678 A | 3/1990 | Yamazaki |
| 4,937,204 A | 6/1990 | Ishibashi et al. |
| 4,969,031 A | 11/1990 | Kobayashi et al. |
| 5,055,887 A | 10/1991 | Yamazaki |
| 5,081,513 A | 1/1992 | Jackson et al. |
| 5,216,262 A | 6/1993 | Tsu |
| 5,357,119 A | 10/1994 | Wang et al. |
| 5,577,061 A | 11/1996 | Hasenberg et al. |
| 5,594,567 A | 1/1997 | Akiyama et al. |
| 5,606,177 A | 2/1997 | Wallace et al. |
| 5,616,515 A | 4/1997 | Okuno |
| 5,627,386 A | 5/1997 | Harvey et al. |
| 5,683,934 A | 11/1997 | Candelaria |
| 5,684,817 A | 11/1997 | Houdre et al. |
| 5,994,164 A | 11/1999 | Fonash et al. |
| 6,058,127 A | 5/2000 | Joannopoulos et al. |
| 6,255,150 B1 | 7/2001 | Wilk et al. |
| 6,274,007 B1 | 8/2001 | Smirnov et al. |
| 6,281,518 B1 | 8/2001 | Sato |
| 6,281,532 B1 | 8/2001 | Doyle et al. |
| 6,326,311 B1 | 12/2001 | Euda et al. |
| 6,344,271 B1 | 2/2002 | Yadav et al. |
| 6,350,993 B1 | 2/2002 | Chu et al. |
| 6,376,337 B1 | 4/2002 | Wang et al. |
| 6,436,784 B1 | 8/2002 | Allam |
| 6,472,685 B2 | 10/2002 | Takagi |
| 6,498,359 B2 | 12/2002 | Schmidt et al. |
| 6,501,092 B1 | 12/2002 | Nikonov et al. |
| 6,521,519 B2 | 2/2003 | Kamath et al. |
| 6,521,549 B1 | 2/2003 | Kamath et al. |
| 6,566,679 B2 | 5/2003 | Nikonov et al. |
| 6,608,327 B1 | 8/2003 | Davis et al. |
| 6,621,097 B2 | 9/2003 | Nikonov et al. |
| 6,638,838 B1 | 10/2003 | Eisenbeiser et al. |
| 6,646,293 B2 | 11/2003 | Emrick et al. |
| 6,673,646 B2 | 1/2004 | Droopad |
| 6,690,699 B2 | 2/2004 | Capasso et al. |
| 6,711,191 B1 | 3/2004 | Kozaki et al. |
| 6,741,624 B2 | 5/2004 | Mears et al. |
| 6,748,002 B2 | 6/2004 | Shveykin |
| 6,816,530 B2 | 11/2004 | Capasso et al. |
| 6,830,964 B1 | 12/2004 | Mears et al. |
| 6,833,294 B1 | 12/2004 | Mears et al. |
| 6,860,964 B2 | 3/2005 | Park |
| 6,878,576 B1 | 4/2005 | Mears et al. |
| 6,891,188 B2 | 5/2005 | Mears et al. |
| 6,897,472 B2 | 5/2005 | Mears et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Krepps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,109,052 B2 | 9/2006 | Mears et al. |
| 7,123,792 B1 | 10/2006 | Mears et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,535,041 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,804,130 B1 | 9/2010 | Fung |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 8,497,171 B1 | 7/2013 | Wu et al. |
| 9,953,874 B2 * | 4/2018 | Chang ............ H01L 21/823431 |
| 2002/0094003 A1 | 7/2002 | Bour et al. |
| 2003/0034529 A1 | 2/2003 | Fitzgerald et al. |
| 2003/0057416 A1 | 3/2003 | Currie et al. |
| 2003/0089899 A1 | 5/2003 | Lieber et al. |
| 2003/0162335 A1 | 8/2003 | Yuki et al. |
| 2003/0215990 A1 | 11/2003 | Fitzgerald et al. |
| 2004/0084781 A1 | 5/2004 | Ahn et al. |
| 2004/0227165 A1 | 11/2004 | Wang et al. |
| 2004/0262594 A1 | 12/2004 | Mears et al. |
| 2004/0262597 A1 | 12/2004 | Mears et al. |
| 2004/0266045 A1 | 12/2004 | Mears et al. |
| 2004/0266046 A1 | 12/2004 | Mears et al. |
| 2004/0266116 A1 | 12/2004 | Mears et al. |
| 2005/0029510 A1 | 2/2005 | Mears et al. |
| 2005/0032247 A1 | 2/2005 | Mears et al. |
| 2005/0163692 A1 | 7/2005 | Atanackovic |
| 2005/0208715 A1 | 9/2005 | Seo et al. |
| 2005/0279991 A1 | 12/2005 | Mears et al. |
| 2005/0282330 A1 | 12/2005 | Mears et al. |
| 2006/0011905 A1 | 1/2006 | Mears et al. |
| 2006/0220118 A1 | 10/2006 | Stephenson et al. |
| 2006/0223215 A1 | 10/2006 | Blanchard |
| 2006/0226502 A1 | 10/2006 | Blanchard |
| 2006/0231857 A1 | 10/2006 | Blanchard |
| 2006/0243964 A1 | 11/2006 | Kreps et al. |
| 2006/0263980 A1 | 11/2006 | Kreps et al. |
| 2006/0267130 A1 | 11/2006 | Rao |
| 2006/0273299 A1 | 12/2006 | Stephenson et al. |
| 2006/0289049 A1 | 12/2006 | Rao |
| 2006/0292765 A1 | 12/2006 | Blanchard et al. |
| 2007/0010040 A1 | 1/2007 | Mears et al. |
| 2007/0012910 A1 | 1/2007 | Mears et al. |
| 2007/0015344 A1 | 1/2007 | Mears et al. |

(56) References Cited

U.S. PATENT DOCUMENTS

| | | |
|---|---|---|
| 2007/0020833 A1 | 1/2007 | Mears et al. |
| 2007/0020860 A1 | 1/2007 | Mears et al. |
| 2007/0063185 A1 | 3/2007 | Rao |
| 2007/0063186 A1 | 3/2007 | Rao |
| 2007/0158640 A1 | 7/2007 | Halilov et al. |
| 2007/0166928 A1 | 7/2007 | Halilov et al. |
| 2007/0187667 A1 | 8/2007 | Halilov et al. |
| 2008/0012004 A1 | 1/2008 | Huang et al. |
| 2008/0197340 A1 | 8/2008 | Mears et al. |
| 2009/0072276 A1 | 3/2009 | Inaba |
| 2009/0267155 A1 | 10/2009 | Izumida et al. |
| 2009/0321820 A1 | 12/2009 | Yamakawa |
| 2010/0270535 A1 | 10/2010 | Halilov et al. |
| 2011/0042758 A1 | 2/2011 | Kikuchi et al. |
| 2011/0215299 A1 | 9/2011 | Rao |
| 2012/0261716 A1 | 10/2012 | Yanagihara |
| 2012/0261754 A1 | 10/2012 | Cheng et al. |
| 2013/0005096 A1 | 1/2013 | Park et al. |
| 2013/0026486 A1 | 1/2013 | Miyoshi et al. |
| 2013/0240836 A1 | 9/2013 | Lee et al. |
| 2015/0035055 A1 | 2/2015 | Wang |
| 2015/0144877 A1 | 5/2015 | Mears et al. |
| 2015/0144878 A1 | 5/2015 | Mears et al. |

FOREIGN PATENT DOCUMENTS

| | | | |
|---|---|---|---|
| JP | 61027681 | | 2/1986 |
| JP | 61145820 | | 7/1986 |
| JP | 61220339 | | 9/1986 |
| JP | 62219665 | | 9/1987 |
| JP | 2000306924 A | * | 11/2000 |
| WO | 96/29728 | | 9/1996 |
| WO | 99/63580 | | 12/1999 |
| WO | 02/103767 | | 12/2002 |
| WO | 2005018005 | | 2/2005 |
| WO | 2005034325 | | 4/2005 |
| WO | 2007011790 | | 1/2007 |
| WO | 2008130899 | | 10/2008 |

OTHER PUBLICATIONS

Luo et al., "Chemical Design of Direct-Gap Light-Emitting Silicon", published in Physical Review Letters, vol. 89, No. 7 (Aug. 12, 2002) 4 pgs. See Priority U.S. Appl. No. 14/948,547, filed Nov. 23, 2015.

Raphael Tsu "Si Based Green ELD: Si-Oxygen Superlattice" wysiwyg://1/http://www3.interscience.wiley.com/cgi-bin/abstract/72512946/start: published online Jul. 21, 2000; 2 pgs. Abstract Only. See Priority U.S. Appl. No. 14/948,547, filed Nov. 23, 2015.

Yu et al., GaAs MOSFET with Oxide Gate Dielectric Grown by Atomic Layer Deposition, Agere Systems, Mar. 2003; 7 pgs. See Priority U.S. Appl. No. 14/948,547, filed Nov. 23, 2015.

Novikov et al., Silicon-based Optoelectronics, 1999-2003, pp. 1-6. See Priority U.S. Appl. No. 14/948,547, filed Nov. 23, 2015.

Fan et al., N- and P-Type SiGe/Si Superlattice Coolers, the Seventeenth Intersociety Conference on Thermomechanical Phenomena in Electronic Systems (ITherm 2000), vol. 1, pp. 304-307, Las Vegas, NV, May 2000; 4 pgs. See Priority U.S. Appl. No. 14/948,547, filed Nov. 23, 2015.

Shah et al., Experimental Analysis and Theoretical Model for Anomalously High Ideality Factors (n>2.0) in AlGaN/GaN P-N Junction Diodes, Journal of Applied Physics, vol. 94, No. 4, Aug. 15, 2003; 4 pgs. See Priority U.S. Appl. No. 14/948,547, filed Nov. 23, 2015.

Ball, Striped Nanowires Shrink Electronics, news@nature.com, Feb. 7, 2002; 2 pgs. See Priority U.S. Appl. No. 14/948,547, filed Nov. 23, 2015.

Fiory et al., Light Emission from Silicon: Some Perspectives and Applications, Journal of Electronic Materials, vol. 32, No. 10, 2003; pp. 1043-1051. See Priority U.S. Appl. No. 14/948,547, filed Nov. 23, 2015.

Lecture 6: Light Emitting and Detecting Devices, MSE 6001, Semiconductor Materials Lectures, Fall 2004; 4 pgs. See Priority U.S. Appl. No. 14/948,547, filed Nov. 23, 2015.

Harvard University Professor and Nanosys Co-Founder, Charlie Lieber, Raises the Stakes in the Development of Nanoscale Superlattice Structures and Nanodevices, Feb. 8, 2002, Nanosys, Inc.; 2 pgs. See Priority U.S. Appl. No. 14/948,547, filed Nov. 23, 2015.

Bu, "FINFET Technology, a substrate prospective", IBM Research, PreT0 Alliance, SOI Conference, 2011, pp. 1-28. See Priority U.S. Appl. No. 14/948,547, filed Nov. 23, 2015.

Xu et al, "MOSFET performance and scalability enhancement by insertion of oxygen layers", Department of Electrical Engineering and Computer Science, University of California, Berkeley, 2012, pp. 1-4. See Priority U.S. Appl. No. 14/948,547, filed Nov. 23, 2015.

R. Tsu "Phenomena in silicon nanostructure devices" published online Sep. 6, 2000 by Applied Physics and Materials Science & Processing, pp. 391-402. See Priority U.S. Appl. No. 14/948,547, filed Nov. 23, 2015.

* cited by examiner

SEMICONDUCTOR DEVICE INCLUDING A SUPERLATTICE AND REPLACEMENT METAL GATE STRUCTURE AND RELATED METHODS

FIELD OF THE INVENTION

The present invention relates to the field of semiconductors, and, more particularly, to semiconductor devices comprising superlattices and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electromuminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc, can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite the advantages provided by such structures, further developments may be desirable for integrating advanced semiconductor materials in various semiconductor devices.

SUMMARY

A method for making a semiconductor device may include forming a plurality of spaced apart shallow trench isolation (STI) regions in a substrate, forming a dummy gate on the substrate between a pair of the STI regions, forming source and drain regions in the substrate on opposing sides of the dummy gate and between the pair of STI regions, and forming a dielectric layer on the substrate surrounding the dummy gate. The method may further include removing the dummy gate and portions of the substrate beneath the dummy gate to define a channel recess in the substrate between the source and drain regions, and forming a superlattice channel in the channel recess including a plurality of stacked group of layers. Each group of layers of the superlattice channel may include a plurality of stacked base semiconductor monolayers defining a base semiconductor portion and at least one non-semiconductor monolayer constrained within a crystal lattice of adjacent base semiconductor portions. The method may also include forming a replacement gate over the superlattice channel and removing the dielectric layer.

More particularly, the method may further include performing a well implant in the substrate between the pair of STI regions. Also, forming the replacement gate may include forming a high K dielectric layer over the superlattice channel, and forming a metal gate electrode over the high K dielectric layer.

By way of example, each base semiconductor portion may comprise silicon, germanium, etc. Also by way of example, the at least one non-semiconductor monolayer may comprise a non-semiconductor selected from the group consisting of oxygen, nitrogen, fluorine, and carbon-oxygen.

In addition, the superlattice channel may further include a base semiconductor cap layer on an uppermost group of layers. Moreover, at least some semiconductor atoms from opposing base semiconductor portions may be chemically bound together through the at least one non-semiconductor monolayer therebetween.

A related semiconductor device may include a substrate having a channel recess therein, a plurality of spaced apart shallow trench isolation (STI) regions in the substrate, and source and drain regions spaced apart in the substrate and between a pair of the STI regions. A superlattice channel may be in the channel recess of the substrate and extend between the source and drain regions, with the superlattice channel including a plurality of stacked group of layers, and each group of layers of the superlattice channel comprising a plurality of stacked base semiconductor monolayers defining a base semiconductor portion and at least one non-semiconductor monolayer constrained within a crystal lattice of adjacent base semiconductor portions. A replacement gate may be over the superlattice channel.

DETAILED DESCRIPTION OF THE PREFERRED EMBODIMENTS

Figure 1:
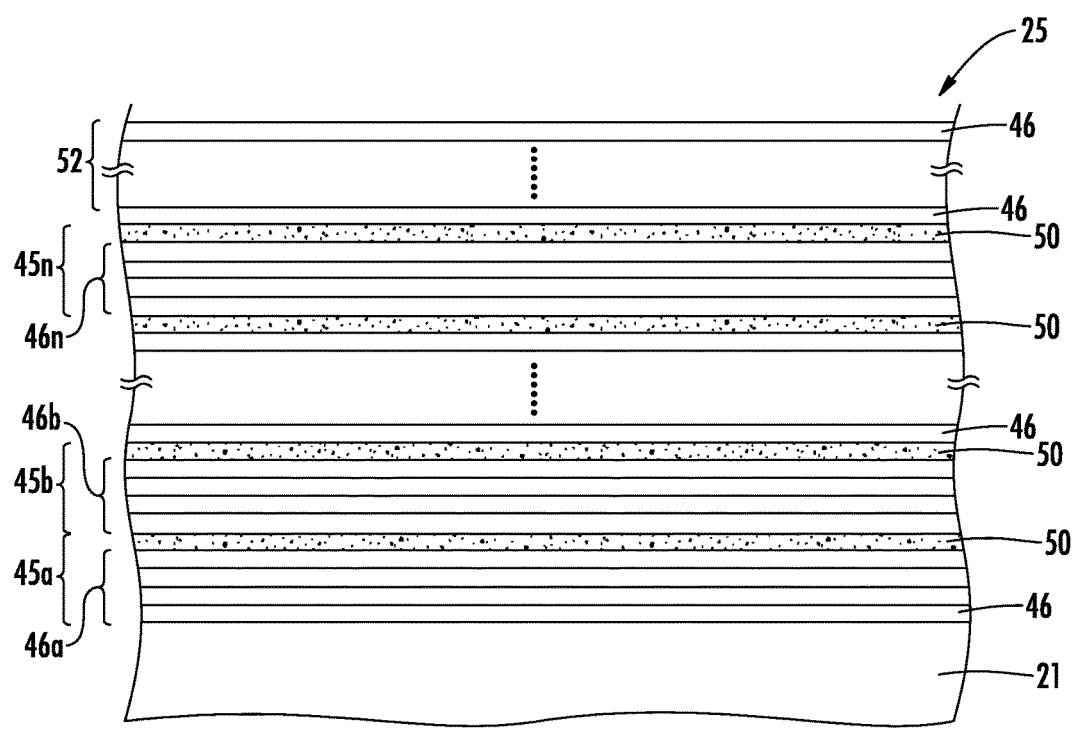
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

The present invention relates to controlling the properties of semiconductor materials at the atomic or molecular level. Further, the invention relates to the identification, creation, and use of improved materials for use in semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
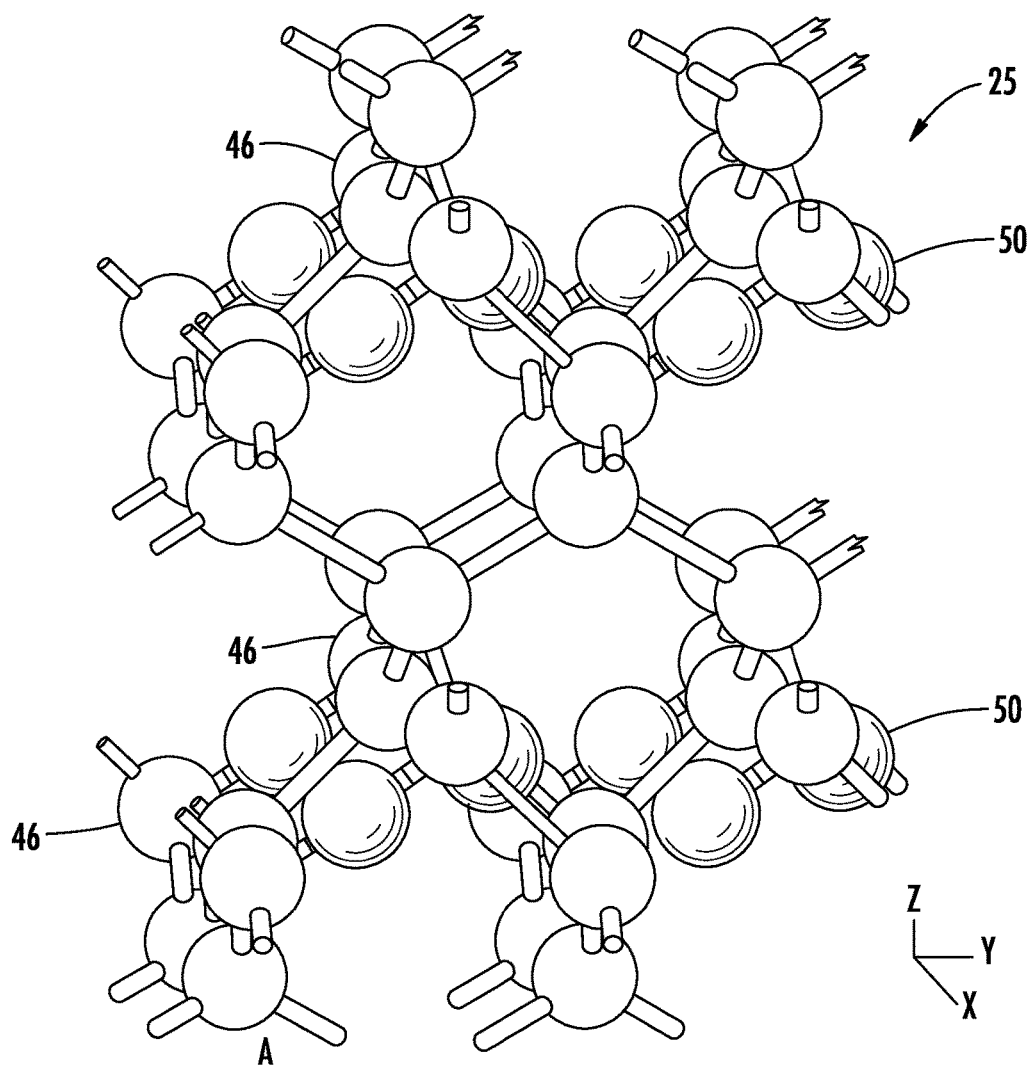
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
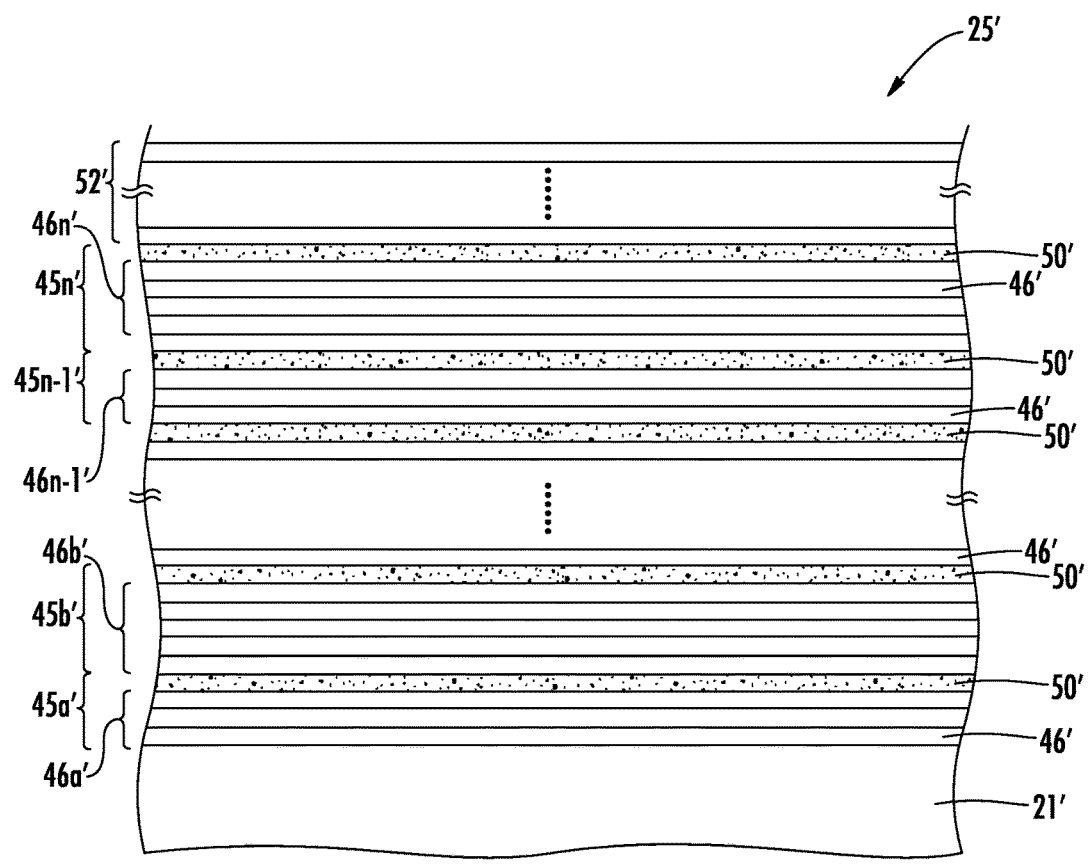
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
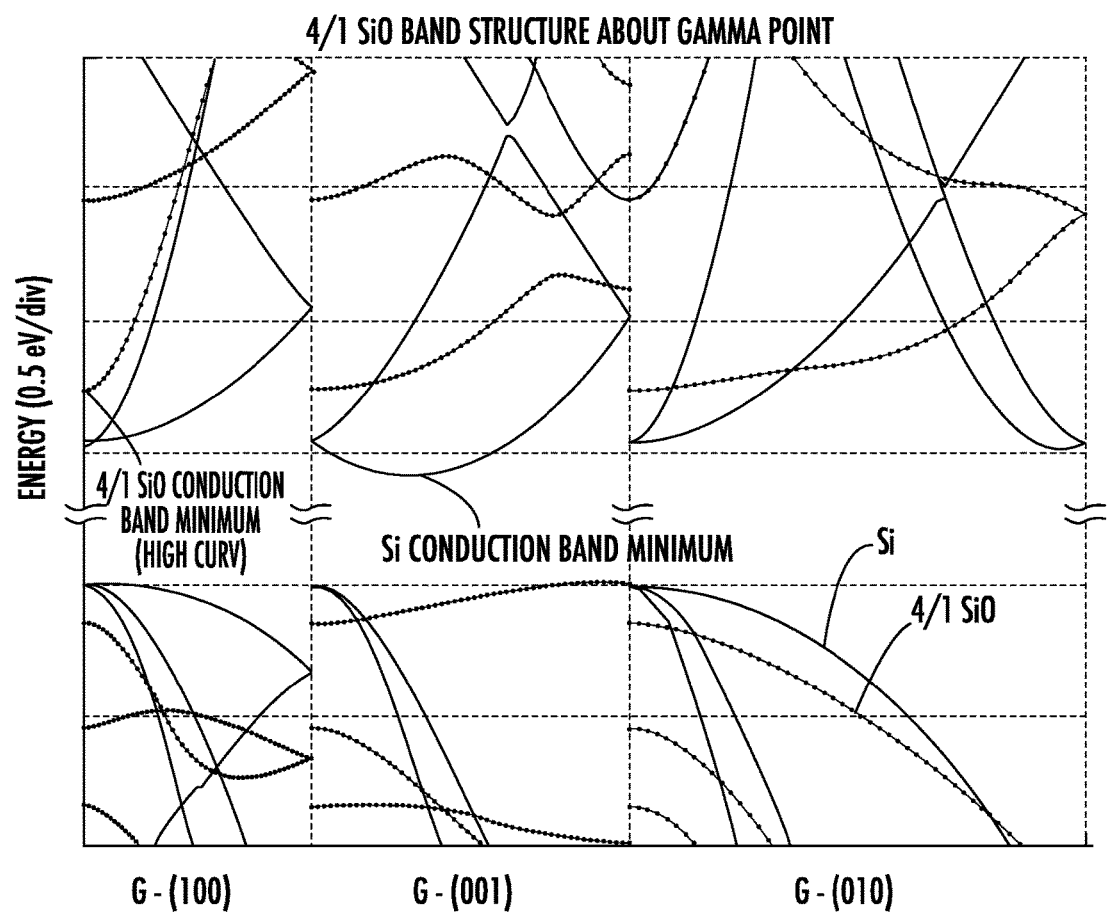
FIG. 4A is a graph of the calculated band structure from the gamma point (G) for both bulk silicon as in the prior art, and for the 4/1 Si/O superlattice as shown in FIGS. 1-2.
Figure 4B:
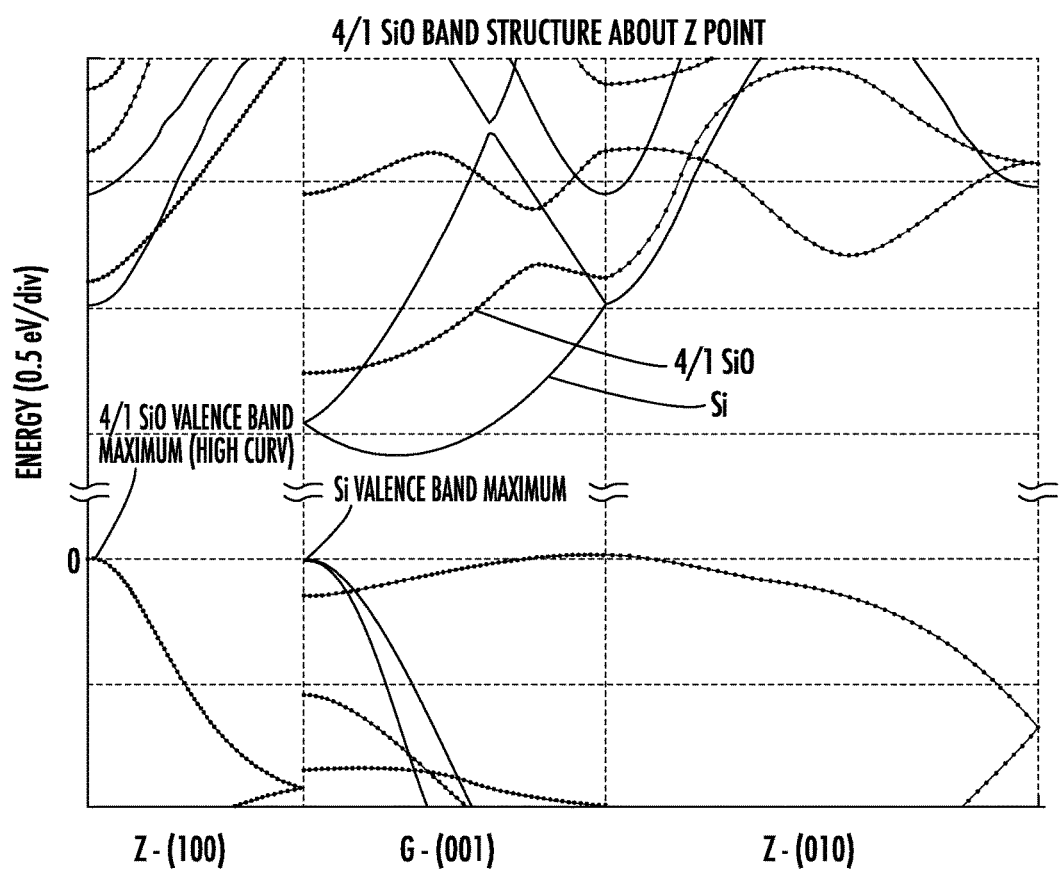
FIG. 4B is a graph of the calculated band structure from the Z point for both bulk silicon as in the prior art, and for the 4/1 Si/O superlattice as shown in FIGS. 1-2.
Figure 4C:
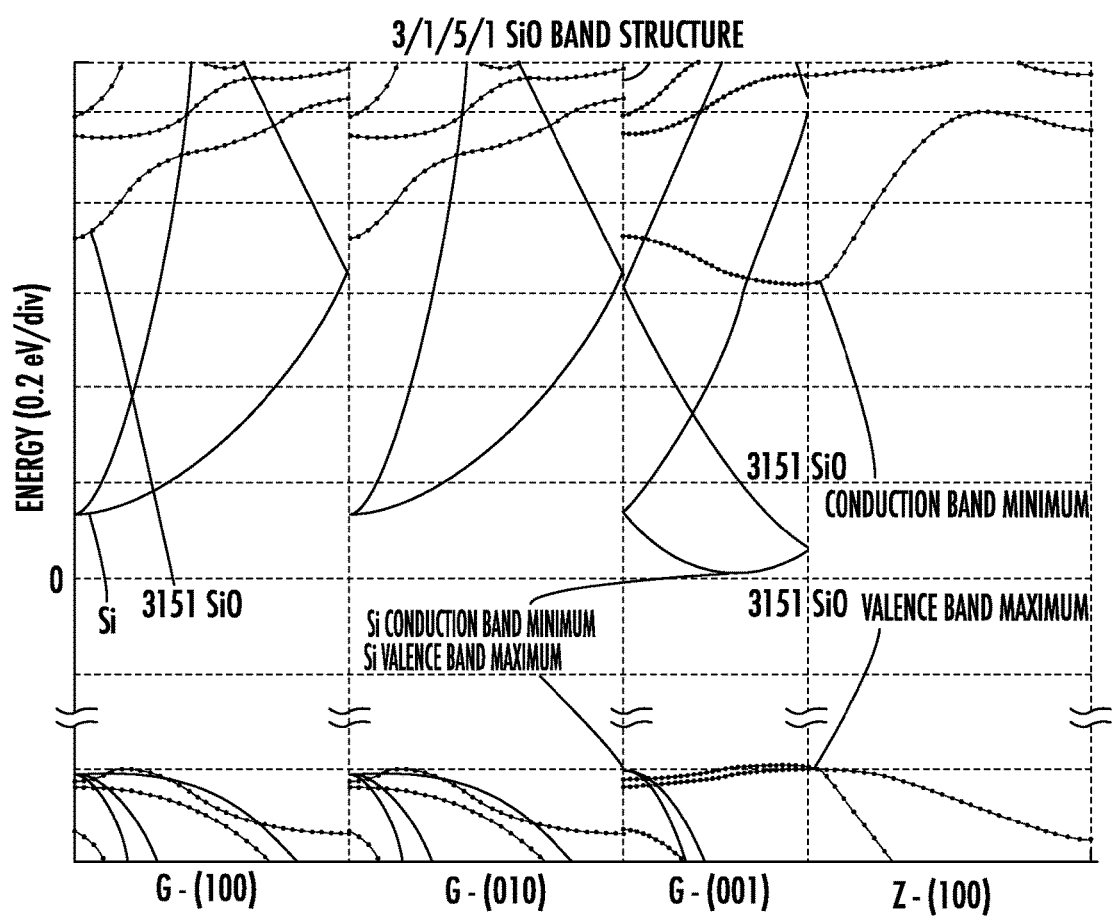
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. AC shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
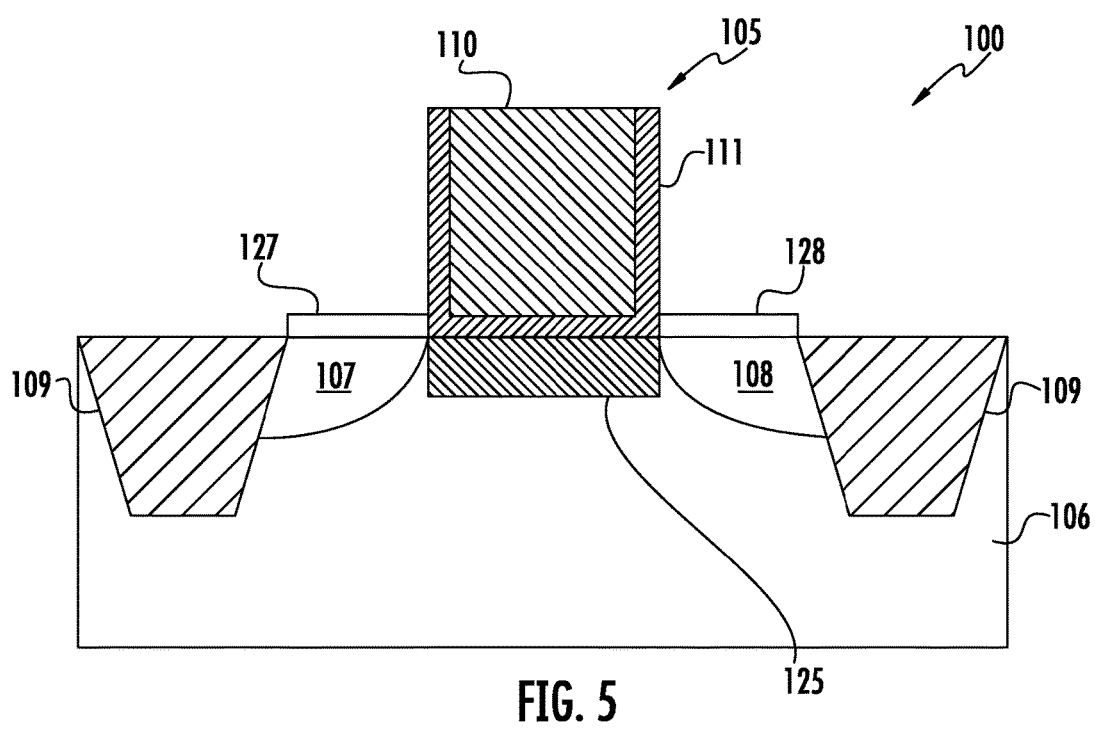
FIG. 5 is a cross-sectional diagram of a semiconductor device in accordance with an example embodiment including a replacement metal gate overlying a superlattice channel layer.

Using the above-described measures, one can select materials having improved band structures for specific purposes. One such example would be a superlattice material layer 125 in a semiconductor device 100 in which the superlattice material is positioned in a channel recess 104 beneath a replacement gate 105, as shown in FIG. 5. The above-described quantum confinement properties of the superlattice material layer 125 when utilized in the channel region of the semiconductor device 100 may provide significant advantages, such as bias temperature instability (BTI) reliability improvement, as well as carrier mobility boost (and, accordingly, NMOS performance improvement), as well as providing a "channel last" integration option, meaning that the channel is formed after the source/drain and dummy gate formation, as will be discussed further below. Moreover, as also described above, the superlattice material may also help reduce leakage in the channel region as well.

In the illustrated example, the semiconductor device 100 is a planar MOSFET device, which may be used for NMOS, PMOS, or CMOS devices, for example. However, it should be noted that the superlattice/gate structure shown in FIG. 5 may be used in other configurations as well, such as vertical devices (e.g., FINFETs, etc.). The semiconductor device 100 illustratively includes a silicon substrate 106, spaced apart source and drain regions 107, 108 in the substrate, and the superlattice material layer 125 which is positioned between the source and drain regions in the channel recess 104 of the substrate. Shallow trench isolation (STI) regions 109 may be included to insulate the source and drain regions 107, 108 from other devices on the substrate 106, as will be appreciated by those skilled in the art. In the illustrated example, the gate 105 is a high K replacement metal gate including a metal gate electrode 110 and a high K dielectric layer 111, and is positioned over the superlattice channel layer 125 laterally between the source and drain regions 107, 108, as shown. The channel of the device 100 may be defined fully or partially within the superlattice channel layer 125, or it may also extend beneath the superlattice channel layer in some embodiments.

Figure 6:
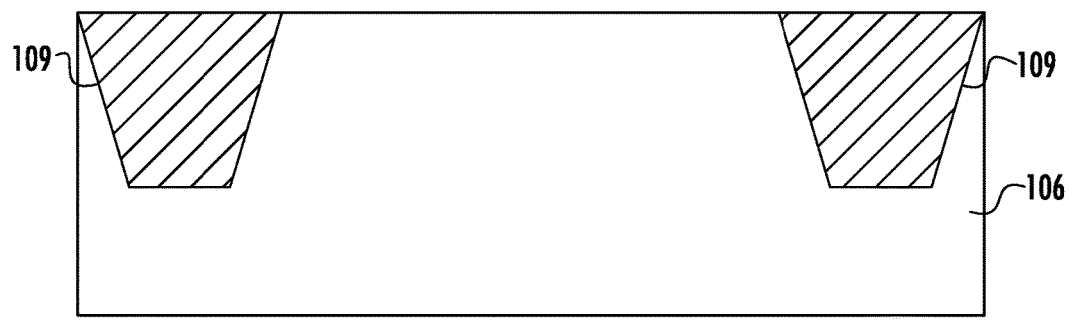
FIGS. 6-13 are a series of cross-sectional diagrams illustrating a method for making the semiconductor device of FIG. 5.
Figure 7:
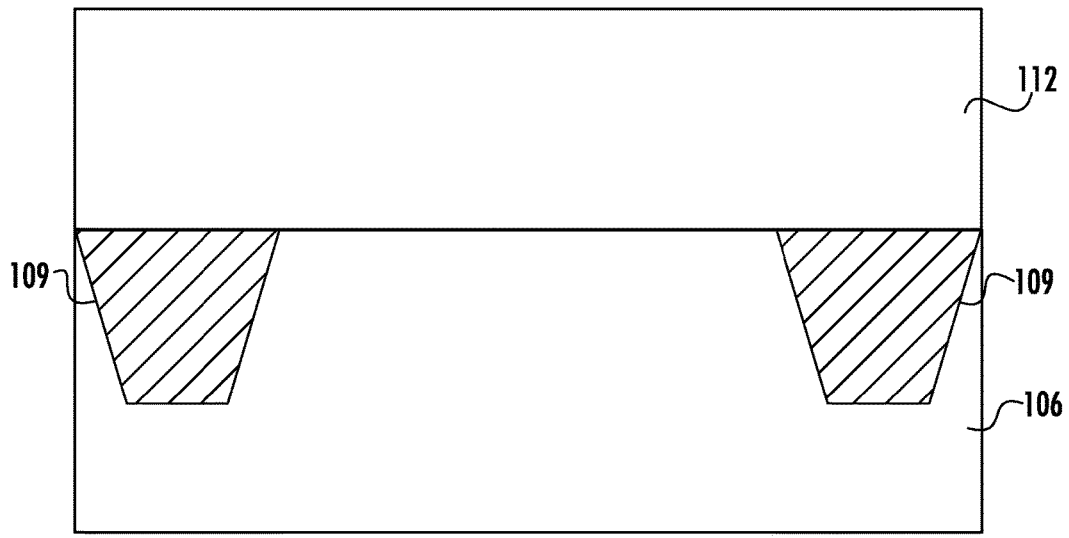
Figure 8:
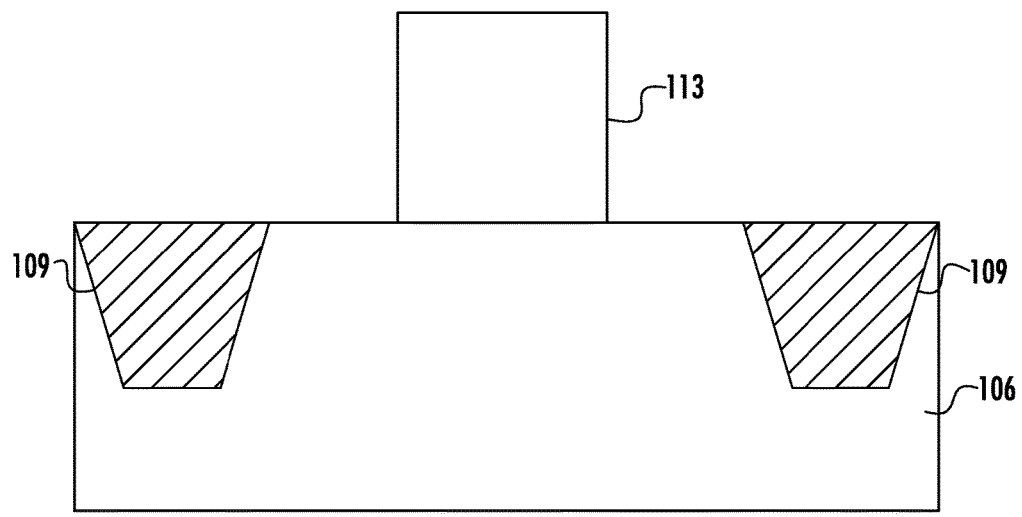
Figure 9:
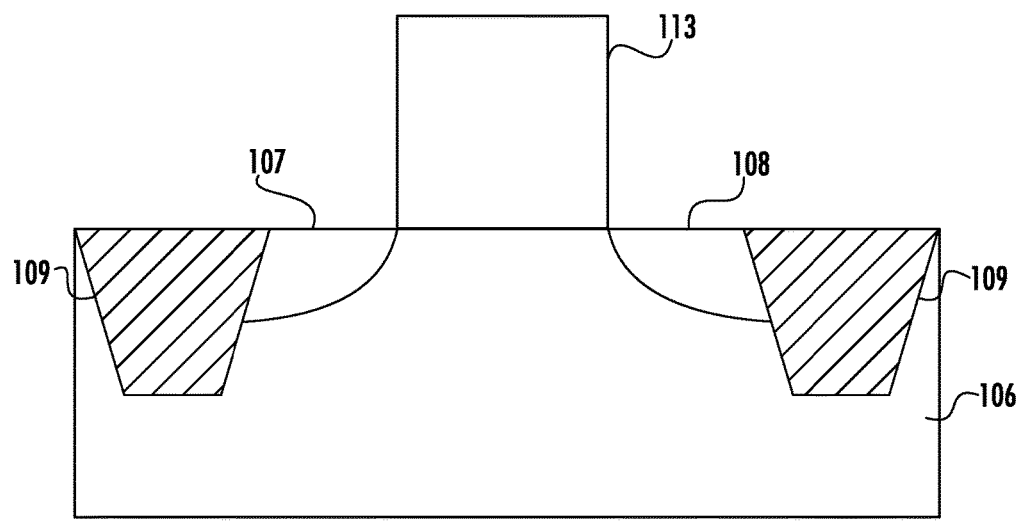

An example method for making the semiconductor device 100 will now be described with reference to FIGS. 6-14. STI and well module preparation may be performed at Blocks 201-202 to form the starting substrate or wafer (FIG. 6), as will be appreciated by those skilled in the art. A "dummy gate" 113 may then be formed on the substrate 106 overlying what is to become the channel region, at Block 203 (FIG. 6). More particularly, the dummy gate 113 formation may include forming a blanket polycrystalline semiconductor layer 112 (e.g., polysilicon) over the substrate 106 and STI regions 109 (FIG. 7), and then patterning the polycrystalline layer to define the dummy gate 113 (FIG. 8). The dummy gate 113 may then be used to align the source and drain 107, 108 implants, at Block 204 (FIG. 9).

Figure 10:
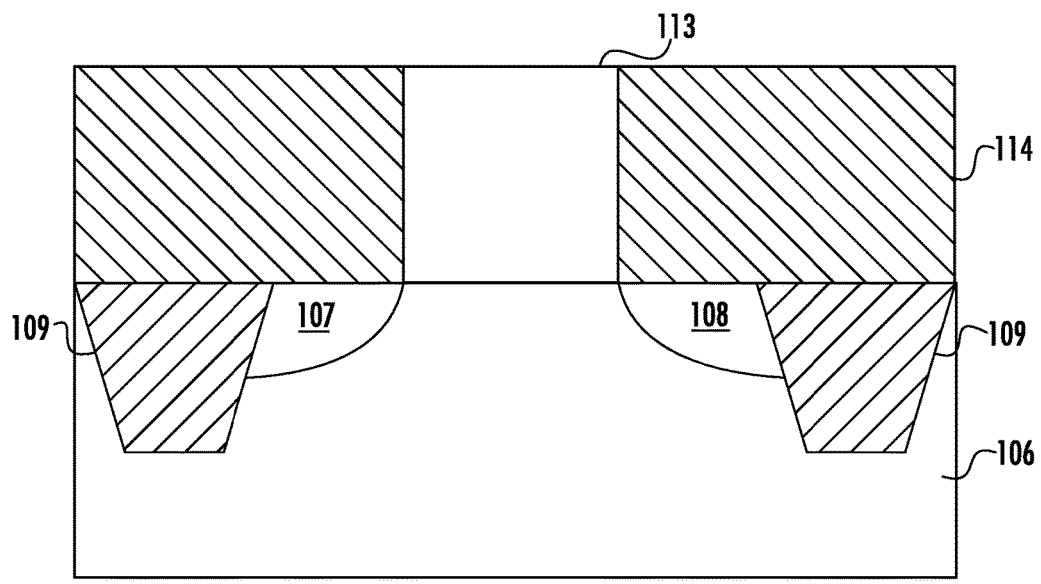
Figure 11:
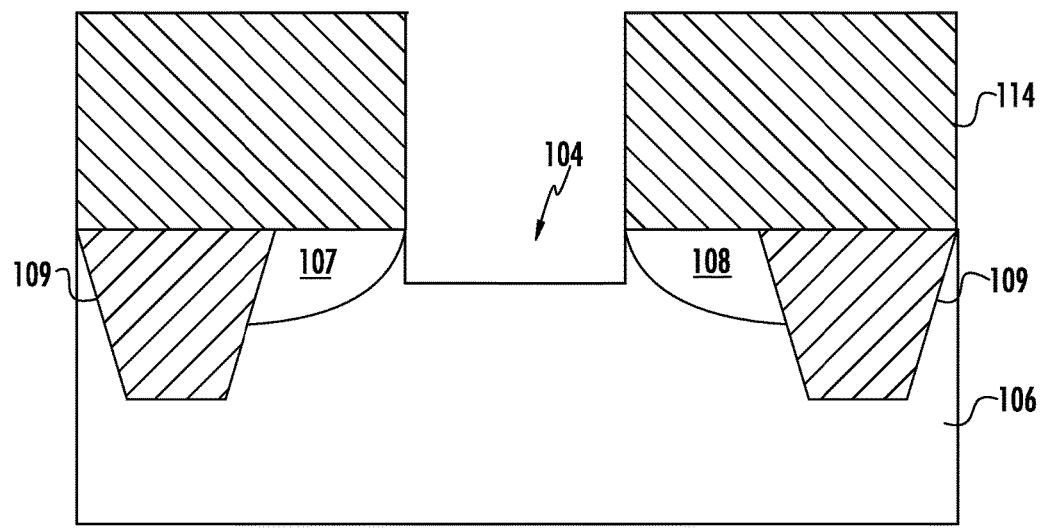
Figure 12:
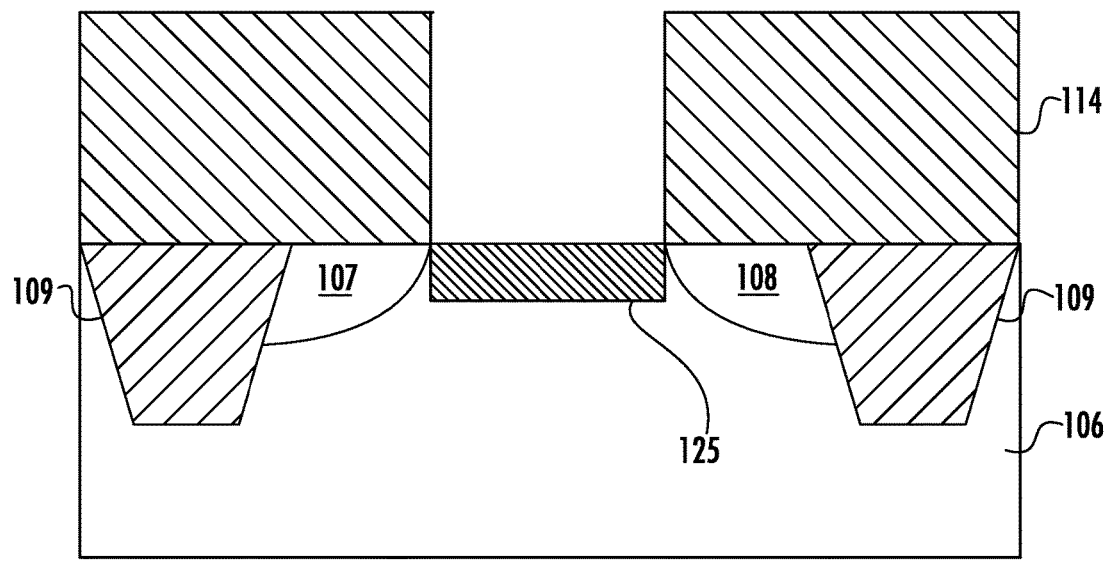
Figure 13:
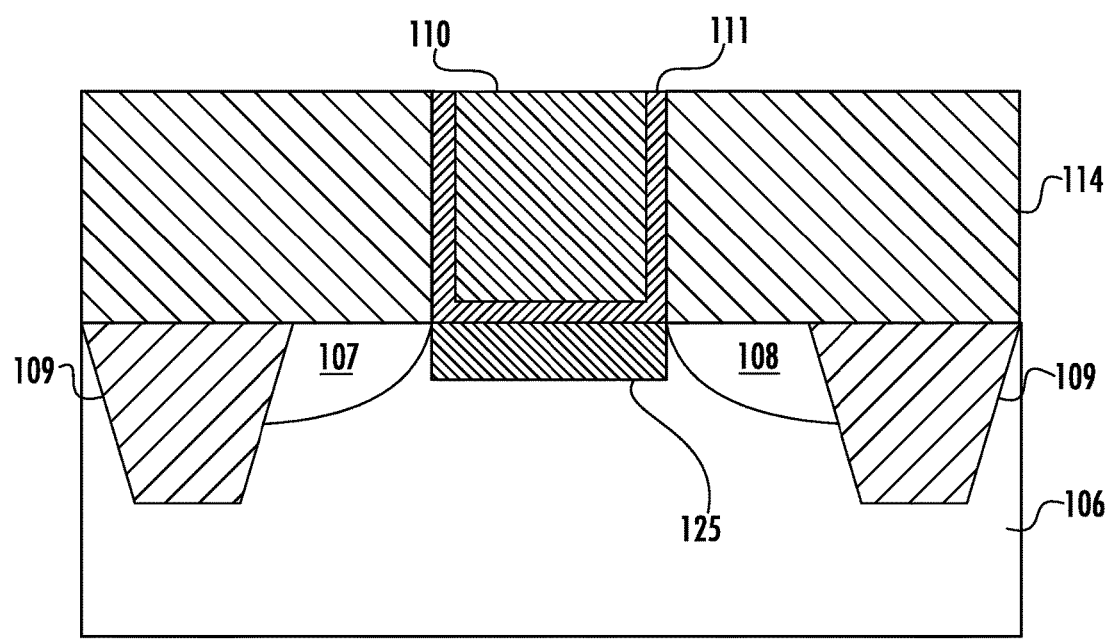
Figure 14:
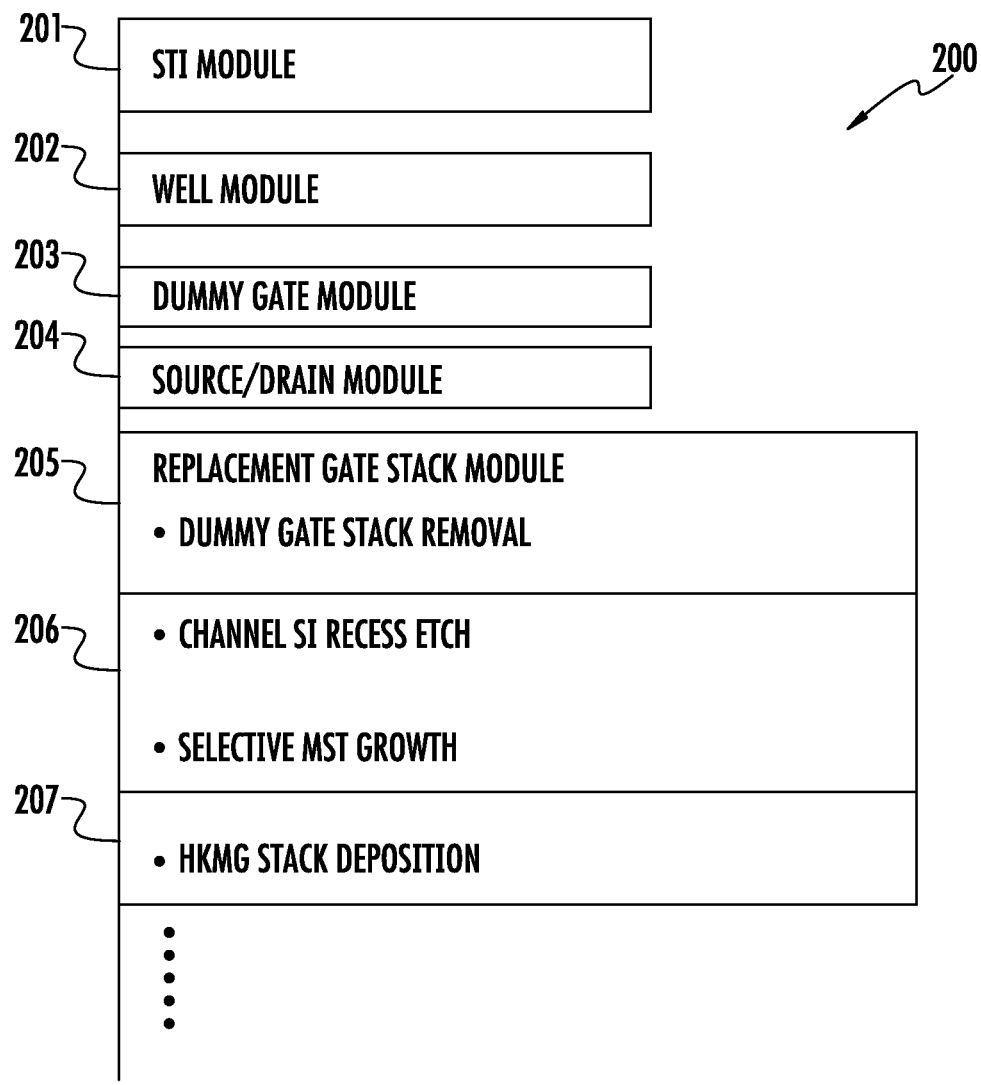
FIG. 14 is a flow diagram corresponding to the method illustrated in FIGS. 5-13.

A dielectric layer 114 (e.g., $SiO_2$) may be formed overlying the source and drain regions 107, 108 and the STI regions 109 and surrounding the dummy gate 113, as seen in FIG. 10. The dummy gate 113 may then be removed (Block 205) to make way for the replacement metal gate 105. Moreover, etching of the dummy gate 113 may extend down into the substrate 106 to create the channel recess 104, as seen in FIG. 11. The superlattice layer 125 may then be formed in the channel recess 104 using the above-described techniques and configurations, at Block 206, as seen in FIG. 12. The replacement metal gate 105 may then be formed by depositing the high K dielectric layer 111, and the metal gate electrode 110, as seen in FIG. 13 (Block 207), as will be appreciated by those skilled in the art. Further semiconductor device processing may then be performed as appropriate for the given device type, as will be appreciated by those skilled in the art. For example, the dielectric layer 114 may be removed, and respective source/drain contacts 127, 128 may be formed, as seen in FIG. 5, for example.

The foregoing metal gate implementation may accordingly not only provide the above-noted advantages of BTI reliability improvement and carrier mobility boost, but it may also provide integration flexibility in terms of gate formation and channel integration. As noted above, the superlattice channel layer 125 may advantageously be formed after the source and drain 107, 108 formation, which may be desirable in that the superlattice channel layer is not subjected to the various processing steps associated with the source/drain formation and dummy gate 113 processing. Moreover, the above-described steps could be re-ordered to provide for a "gate first" option, rather than the exemplary "gate last" approach set forth above. Such processing flexibility may be advantageous for CMOS implementations at 32 nm nodes or below, for example, although the configurations described herein may be used with other device sizes as well.

Many modifications and other embodiments will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the present disclosure and the following claims.

That which is claimed is:

1. A semiconductor device comprising:
    a substrate having a channel recess therein;
    a plurality of spaced apart shallow trench isolation (STI) regions in said substrate;
    source and drain regions spaced apart in the substrate and between a pair of the STI regions; and
    a superlattice channel in the channel recess of said substrate extending between the source and drain regions, the superlattice channel contacting the source and drain regions, the superlattice channel including a plurality of stacked groups of layers, each group of layers of the superlattice channel comprising a plurality of stacked base semiconductor monolayers defining a base semiconductor portion and at least one non-semiconductor monolayer constrained within a crystal lattice of adjacent base semiconductor portions; and
    a replacement gate over the superlattice channel having lateral edges vertically aligned with lateral edges of the superlattice channel.

2. The semiconductor device of claim 1 further comprising a well implant in the substrate between the pair of STI regions.

3. The semiconductor device of claim 1 wherein the replacement gate comprises:
    a high K dielectric layer over the superlattice channel; and
    a metal gate electrode over the high K dielectric layer.

4. The semiconductor device of claim 1 wherein each base semiconductor portion comprises silicon.

5. The semiconductor device of claim 1 wherein each base semiconductor portion comprises germanium.

6. The semiconductor device of claim 1 wherein the at least one non-semiconductor layer comprises oxygen.

7. The semiconductor device of claim 1 wherein the at least one non-semiconductor monolayer comprises a non-semiconductor selected from the group consisting of oxygen, nitrogen, fluorine, and carbon-oxygen.

8. The semiconductor device of claim 1 wherein the superlattice channel further comprises a base semiconductor cap layer on an uppermost group of layers.

9. The semiconductor device of claim 1 wherein at least some semiconductor atoms from opposing base semiconductor portions are chemically bound together through the at least one non-semiconductor monolayer therebetween.

10. A semiconductor device comprising:
    a substrate having a channel recess therein;
    a plurality of spaced apart shallow trench isolation (STI) regions in said substrate;
    source and drain regions spaced apart in the substrate and between a pair of the STI regions;
    a superlattice channel in the channel recess of said substrate and extending between the source and drain regions, the superlattice channel contacting the source and drain regions, the superlattice channel including a plurality of stacked groups of layers, each group of layers of the superlattice channel comprising a plurality of stacked silicon monolayers defining a base silicon portion and at least one oxygen monolayer constrained within a crystal lattice of adjacent base silicon portions; and
    a replacement gate comprising a high K dielectric layer over the superlattice channel and a metal gate electrode over the high K dielectric layer, the replacement gate having lateral edges vertically aligned with lateral edges of the superlattice channel.

11. The semiconductor device of claim 10 further comprising a well implant in the substrate between the pair of STI regions.

12. The semiconductor device of claim 10 wherein the superlattice channel further comprises a base silicon cap layer on an uppermost group of layers.

13. The semiconductor device of claim 10 wherein at least some semiconductor atoms from opposing base silicon portions are chemically bound together through the at least one oxygen monolayer therebetween.

14. A semiconductor device comprising:
a substrate;
a pair of spaced apart isolation regions in said substrate;
source and drain regions spaced apart in the substrate and between the pair of the isolation regions;
the substrate having a channel recess extending between the source and drain regions;
a superlattice channel in the channel recess and contacting the source and drain regions, the superlattice channel including a plurality of stacked groups of layers, each group of layers of the superlattice channel comprising a plurality of stacked base semiconductor monolayers defining a base semiconductor portion and at least one non-semiconductor monolayer constrained within a crystal lattice of adjacent base semiconductor portions; and
a gate over the superlattice channel comprising a dielectric layer and a metal gate electrode thereon, the gate having lateral edges vertically aligned with lateral edges of the superlattice channel.

15. The semiconductor device of claim 14 further comprising a well implant in the substrate between the pair of isolation regions.

16. The semiconductor device of claim 14 wherein the dielectric layer comprises a high K dielectric layer.

17. The semiconductor device of claim 14 wherein each base semiconductor portion comprises silicon.

18. The semiconductor device of claim 14 wherein each base semiconductor portion comprises germanium.

19. The semiconductor device of claim 14 wherein the at least one non-semiconductor layer comprises oxygen.

20. The semiconductor device of claim 14 wherein the at least one non-semiconductor monolayer comprises a non-semiconductor selected from the group consisting of oxygen, nitrogen, fluorine, and carbon-oxygen.

21. The semiconductor device of claim 14 wherein the superlattice channel further comprises a base semiconductor cap layer on an uppermost group of layers.

22. The semiconductor device of claim 14 wherein at least some semiconductor atoms from opposing base semiconductor portions are chemically bound together through the at least one non-semiconductor monolayer therebetween.

* * * * *